United States Patent
Wang

(10) Patent No.: US 10,128,326 B2
(45) Date of Patent: Nov. 13, 2018

(54) RESISTOR HAVING INCREASING RESISTANCE DUE TO INCREASING VOLTAGE

(71) Applicant: Chung Lin Wang, Hsinchu (TW)

(72) Inventor: Chung Lin Wang, Hsinchu (TW)

( * ) Notice: Subject to any disclaimer, the term of this patent is extended or adjusted under 35 U.S.C. 154(b) by 0 days.

(21) Appl. No.: 15/922,896

(22) Filed: Mar. 15, 2018

(65) Prior Publication Data

US 2018/0277617 A1     Sep. 27, 2018

(30) Foreign Application Priority Data

Mar. 24, 2017   (TW) .............................. 106110039 A

(51) Int. Cl.
| | | |
|---|---|---|
| *H01C 7/10* | (2006.01) | |
| *H01L 49/02* | (2006.01) | |
| *H01C 7/102* | (2006.01) | |

(52) U.S. Cl.
CPC ............. *H01L 28/20* (2013.01); *H01C 7/102* (2013.01)

(58) Field of Classification Search
CPC .................................................... H01C 7/102
USPC ..................................................... 338/20, 13
See application file for complete search history.

(56) References Cited

U.S. PATENT DOCUMENTS

| | | | | |
|---|---|---|---|---|
| 3,934,331 A | * | 1/1976 | Sugiyama | ............... H01L 21/00 438/464 |
| 4,062,033 A | * | 12/1977 | Suzuki | .................... H01L 21/00 257/474 |
| 5,751,027 A | * | 5/1998 | Sawada | ............. H01L 21/28587 257/192 |
| 6,200,838 B1 | * | 3/2001 | Inoue | ................... H01L 27/0883 257/192 |
| 9,171,967 B2 | * | 10/2015 | Takizawa | ............... H01L 29/872 |
| 2001/0013609 A1 | * | 8/2001 | Abe | ..................... H01L 33/0062 257/101 |
| 2010/0224908 A1 | * | 9/2010 | Nakazawa | .......... H01L 27/0605 257/140 |
| 2014/0203393 A1 | * | 7/2014 | Kawakami | .......... H01L 29/8611 257/471 |

* cited by examiner

*Primary Examiner* — Kyung Lee
(74) *Attorney, Agent, or Firm* — Cheng-Ju Chiang

(57) ABSTRACT

A resistor comprises a substrate, an upper ohmic region disposed on a selective one of an upper surface and a lower surface of the substrate and a lower ohmic region disposed on the other one of the upper surface and the lower surface of the substrate. An upper metal conducting layer overlies on the substrate and the upper ohmic region, and a lower metal conducting layer overlies on the lower ohmic region. When the upper and lower metal conducting layers are electrified, the upper ohmic region and the lower ohmic region are electrically connected, and a contact interface between the substrate and the upper metal conducting layer forms an enlarged depletion region to block electrical conduction therebetween. As a result, a resistance value of the resistor is increased when an applied voltage on the resistor is increased.

8 Claims, 17 Drawing Sheets

RESISTOR HAVING INCREASING RESISTANCE DUE TO INCREASING VOLTAGE

BACKGROUND OF THE INVENTION

1. Field of the Invention

The present invention relates to a resistor. Particularly, the present invention relates to a resistor having increasing resistance due to increasing voltage(s) applied thereon.

2. The Related Arts

Resistive elements are common components in electronic circuits, and are generally referred to all of electrical components forming resistance. The main function of a resistive element is to provide impedance in a circuit against an electrical current passing through the circuit in order to control a ratio of a voltage to the electrical current in the circuit. There are many kinds of resistive elements in view of usages and characteristics of the resistive elements. According to material for producing the resistive elements, the resistive elements are classified to include metal resistive elements, electrolyte resistive elements and semiconductor resistive elements, . . . etc.

With reference to FIG. 1, an exemplified conventional semiconductor resistor element is shown. The conventional semiconductor resistor includes a semiconductor layer L(n−) with a low-concentration doped base, a semiconductor layer H(n+) doped with a high concentration and an electrode metal contact layer M being disposed above the semiconductor layer L(n−), and another semiconductor layer H(n+) doped with a high concentration and another electrode metal contact layer M being disposed below the semiconductor layer L(n−). An electrical current and voltage relationship curve of the conventional semiconductor resistor is linearly distributed.

However, when using such a conventional resistor element, it is necessary to select a resistor element having a suitable resistance value according to voltage and electrical current conditions of a working environment of the resistor element. Otherwise, if a resistor element with resistance being too small is selected, a circuit having such a resistor element may be easily overloaded while applied voltage of the circuit raises even though the circuit is easier to be initiated due to such a resistor element, and the circuit may be eventually burned to be broken and become unavailable because of being overloaded. If a resistor element with resistance being too large is selected, a circuit having such a resistor element may be slow to be initiated, and may be even unable to be initiated. Therefore, the above mentioned resistive element has its own limitations of regulated conditions regarding voltages and electrical currents. In a condition of any resistor element having resistance excessing a regulated value, a circuit having such a resistor element may malfunction due to excessively high power or irreversible damage on the circuit may be caused.

SUMMARY OF THE INVENTION

In view of the above descriptions, the resistor element of conventional technology cannot be used to maintain steady electrical currents in a variety of voltage conditions. Besides, situations of malfunction or damage may happen due to use of such a resistor element. Hence, the conventional resistor element is indeed required to be further improved.

Accordingly, an object of the present invention is to provide a resistor that can be used to solve the above mentioned problems in conventional technology.

The technical solution of the present invention adopted to solve the above mentioned problems in conventional technology is to provide a resistor having increasing resistance due to increasing voltage(s) applied thereon. The resistor in accordance with the present invention comprises a substrate, an upper ohmic region, an upper metal conducting layer, a lower ohmic region and a lower metal conducting layer. The substrate is a first electrically conductive type semiconductor doped with a low concentration. The upper ohmic region is the first electrically conductive type semiconductor doped with a high concentration, and is partially formed at an intermediate position of an upper surface of the substrate. The upper metal conducting layer completely covers an upper face of the upper ohmic region, and covers at least two different unconnected parts of the upper surface of the substrate. An upper ohmic contact interface is formed at a contact-interface position of the upper metal conducting layer with the upper ohmic region, and an upper reverse-voltage barrier interface is formed at a contact-interface position of the upper metal conducting layer with the substrate. The lower ohmic region is the first electrically conductive type semiconductor doped with a high concentration. The lower ohmic region is disposed opposite to the upper ohmic region and is partially formed at an intermediate position of a lower surface of the substrate. The lower metal conducting layer covers a lower face of the lower ohmic region. A lower ohmic contact interface formed at a contact-interface position of the lower metal conducting layer with the lower ohmic region. When the lower metal conducting layer is electrically connected to a positive reference voltage and the upper metal conducting layer is electrically connected to a negative reference voltage, a conductive channel is formed from the lower ohmic contact interface to the upper ohmic contact interface, and the substrate and the upper metal conducting layer are reversely biased. The upper reverse-voltage barrier interface forms a depletion region being enlarged to block the conductive channel when an applied voltage thereon increases, and a resistance value of the resistor is increased when the applied voltage is increased.

In a resistor in accordance with another embodiment of the present invention, the first electrically conductive type semiconductor is an N-type semiconductor.

In a resistor in accordance with another embodiment of the present invention, the first electrically conductive type semiconductor is a P-type semiconductor.

In a resistor in accordance with another embodiment of the present invention, the upper ohmic region is embedded inwardly from the upper surface of the substrate.

In a resistor in accordance with another embodiment of the present invention, the upper ohmic region is formed by protruding outwardly from the upper surface of the substrate.

In a resistor in accordance with another embodiment of the present invention, a plurality of upper ohmic regions are provided as the upper ohmic region.

In a resistor in accordance with another embodiment of the present invention, the resistor further comprises an upper insulation layer. The upper insulation layer is formed at an outer edge of the upper ohmic region and formed to cover the upper surface of the substrate. The upper metal conducting layer covers the whole upper face of the upper ohmic region and covers the upper insulation layer.

In a resistor in accordance with another embodiment of the present invention, the lower metal conducting layer covers completely the lower face of the lower ohmic region, and covers at least two different unconnected parts of the lower surface of the substrate. A lower reverse-voltage barrier interface is formed at a contact-interface position of the lower metal conducting layer with the substrate. When the upper metal conducting layer is electrically connected to a positive reference voltage and the lower metal conducting layer is electrically connected to a negative reference voltage, a conductive channel is formed from the upper ohmic contact interface to the lower ohmic contact interface. The lower metal conducting layer and the substrate are reversely biased. The lower reverse-voltage barrier interface forms a depletion region being enlarged to block the conductive channel when an applied voltage thereon increases. A resistance value of the resistor is increased when the applied voltage is increased.

Via technical solution(s) adopted in the present invention, the resistor in accordance with the present invention is opened due to electrical currents being rapidly conducted via ohmic contact interfaces, and the depletion region is enlarged via reverse bias when an applied voltage thereon increases in order to block the conductive channel. As a result, its resistive value increases when the applied voltage increases. When the applied voltage is high enough to a certain extent, the depletion region is enlarged to completely block the conductive channel, and the circuit having the resistor is in a steady status. Hence, the resistor in accordance with the present invention is initiated by rapid conduction of electrical currents passing therethrough when the resistor is electrified. When an applied voltage thereon increases, its conductive channel is gradually narrowed and its resistive value is gradually raised. In a situation that "pin-off" occurs when the applied voltage is high enough, the resistor is able to stabilize electrical currents passing therethrough in order to protect the resistor and prevent the resistor from damage caused by excess high voltages.

Besides, in another preferred embodiment in accordance with the present invention, the resistor has a two-way structure oppositely disposed therein. Hence, regardless applied voltages thereon are positive or negative, the resistor is able to achieve the following effects: 1) electrical currents in the resistor are rapidly conducted; 2) a resistive value of the resistor is increased when an applied voltage thereon increases; 3) electrical currents passing through the resistor gradually vary until the electrical currents are stabilized; and 4) the resistor is able to resist high voltages, etc. Since the resistor is designed to be convenient for circuit connection from any arbitrary connective direction thereof, the resistor is applicable to both of direct currents (DC) and alternating currents (AC).

In comparison, the resistor in accordance with the present invention is electrically connected via an upper ohmic region and a lower ohmic region between which there is almost no potential barrier disposed. Besides, the resistor has only two metal conducting layers for electrical connection. It can be concluded that the resistor in accordance with the present invention has a simple structure, and does not need any complicated structure similar to a structure of any resistive element of ordinary transistors. Hence, the resistor in accordance with the present invention is able to rapidly electrically conducted, requires only a relatively simple manufacturing process, and is relatively easier to be miniaturized in sizes.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENT

With reference to FIG. 2 to FIG. 10, a resistor 100 in accordance with a first preferred embodiment of the present invention is illustrated as following. Illustrations of the first preferred embodiment of the present invention are used to demonstrate the preferred embodiment being one of embodiments of the present invention rather than to limit embodiments of the present invention.

Figure 1:
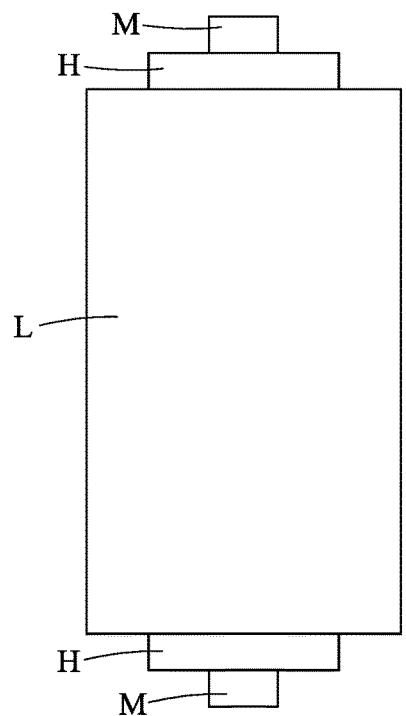
FIG. 1 shows a schematic elevational side view of a conventional resistance component.
Figure 2:
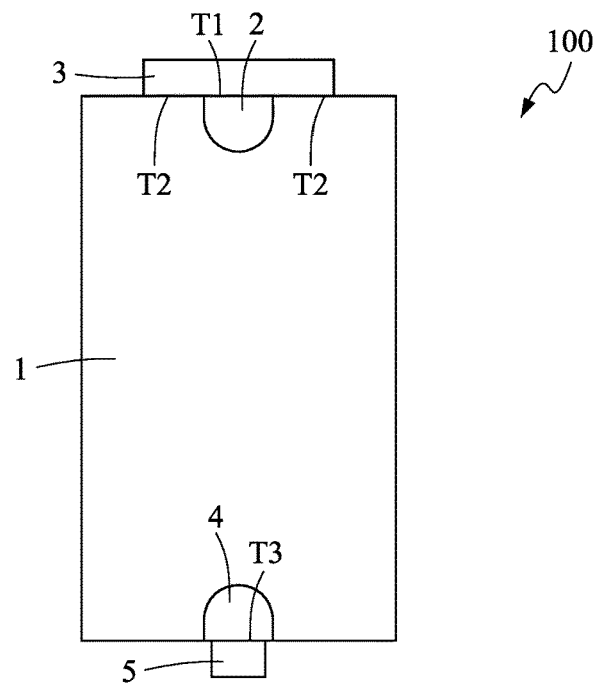
FIG. 2 shows a schematic elevational side view of a resistor in accordance with a first preferred embodiment of the present invention.

With reference to FIG. 2, a resistor 100 in accordance with a first preferred embodiment of the present invention comprises a substrate 1, an upper ohmic region 2, an upper metal conducting layer 3, a lower ohmic region 4 and a lower metal conducting layer 5.

In this first embodiment, the substrate 1, the upper ohmic region 2 and the lower ohmic region 4 are semiconductors of a same electrically conductive type. The substrate 1 is doped with a low concentration, and the upper ohmic region 2 and the lower ohmic region 4 are respectively doped with a high concentration. A base material of the semiconductors for the substrate 1, the upper ohmic region 2 and the lower ohmic region 4 can be any kind of semiconductor material, such as Si, SiC, GaN/Si and GaAs, etc. The upper ohmic region 2 is formed as a well-shaped high-concentration doped region embedded downwardly/inwardly from an intermediate position of an upper surface of the substrate 1.

In this first embodiment, the upper metal conducting layer 3 comprises an upper ohmic contact interface T1 and a Schottky contact interface. In particular, the upper metal conducting layer 3 is deposited on an upper side of the upper ohmic region 2 and on the upper surface of the substrate 1. The upper metal conducting layer 3 completely covers the upper ohmic region 2 and forms the upper ohmic contact interface T1 along a contact interface of the upper metal conducting layer 3 with the upper ohmic region 2. In addition, the upper metal conducting layer 3 covers at least two different unconnected parts of the upper surface of the substrate 1, and forms an upper reverse-voltage barrier interface T2 along a contact interface of the upper metal conducting layer 3 with the substrate 1. In this first embodiment, the upper reverse-voltage barrier interface T2 is the Schottky contact interface.

In this first embodiment, the lower ohmic region 4, the substrate 1 and the upper ohmic region 2 are semiconductors of a same electrically conductive type. The lower ohmic region 4 is disposed opposite to the upper ohmic region 2, and is formed as a well-shaped high-concentration doped region embedded upwardly/inwardly from an intermediate position of a lower surface of the substrate 1.

In this first embodiment, the lower metal conducting layer 5 partially covers the lower ohmic region 4 at a lower face of the lower ohmic region 4, and does not directly contact the substrate 1. The lower metal conducting layer 5 forms the lower ohmic contact interface T3 along a contact interface of the lower metal conducting layer 5 with the lower ohmic region 4. The lower ohmic contact interface T3 and the upper ohmic contact interface T1 form together a structure of ohmic conductive channel, and are electrically conductive to each other.

Alternatively, in this first embodiment, the substrate 1, the upper ohmic region 2 and the lower ohmic region 4 are all an N-type semiconductor. As a result, the resistor 100 has a faster traveling velocity of electric charge. Of course, the present invention is not limited by the above mentioned alternative(s). The substrate 1, the upper ohmic region 2 and the lower ohmic region 4 are all a P-type semiconductor.

With reference to FIG. 6A to FIG. 6D, when the lower metal conducting layer 5 is electrically connected to a positive reference voltage and the upper metal conducting layer 3 is electrically connected to a negative reference voltage, a conductive channel C is formed from the lower ohmic contact interface T3 to the upper ohmic contact interface T1. The substrate 1 and the upper metal conducting layer 3 are reversely biased. The upper reverse-voltage barrier interface T2 (the Schottky contact interface) forms a depletion region E being enlarged when an applied voltage thereon increases.

Figure 6A:
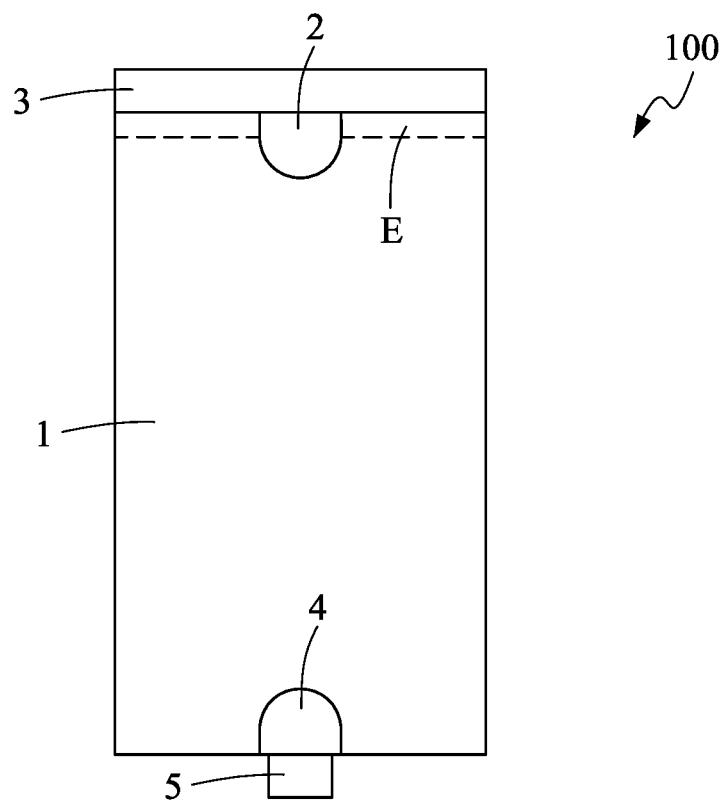
FIGS. 6A to 6D shows schematic elevational side views of the resistor in use in accordance with the first preferred embodiment of the present invention.

In particular, as shown in FIG. 6A, when the resistor 100 in accordance with the first preferred embodiment of the present invention is static without being electrically connected to any power source, the upper reverse-voltage barrier interface T2 (the Schottky contact interface) is in an electrically neutral status. A thin-layered depletion region E is formed at the upper reverse-voltage barrier interface T2 because the substrate 1 is electrically induced by electrical charge of the upper metal conducting layer 3.

Figure 6B:
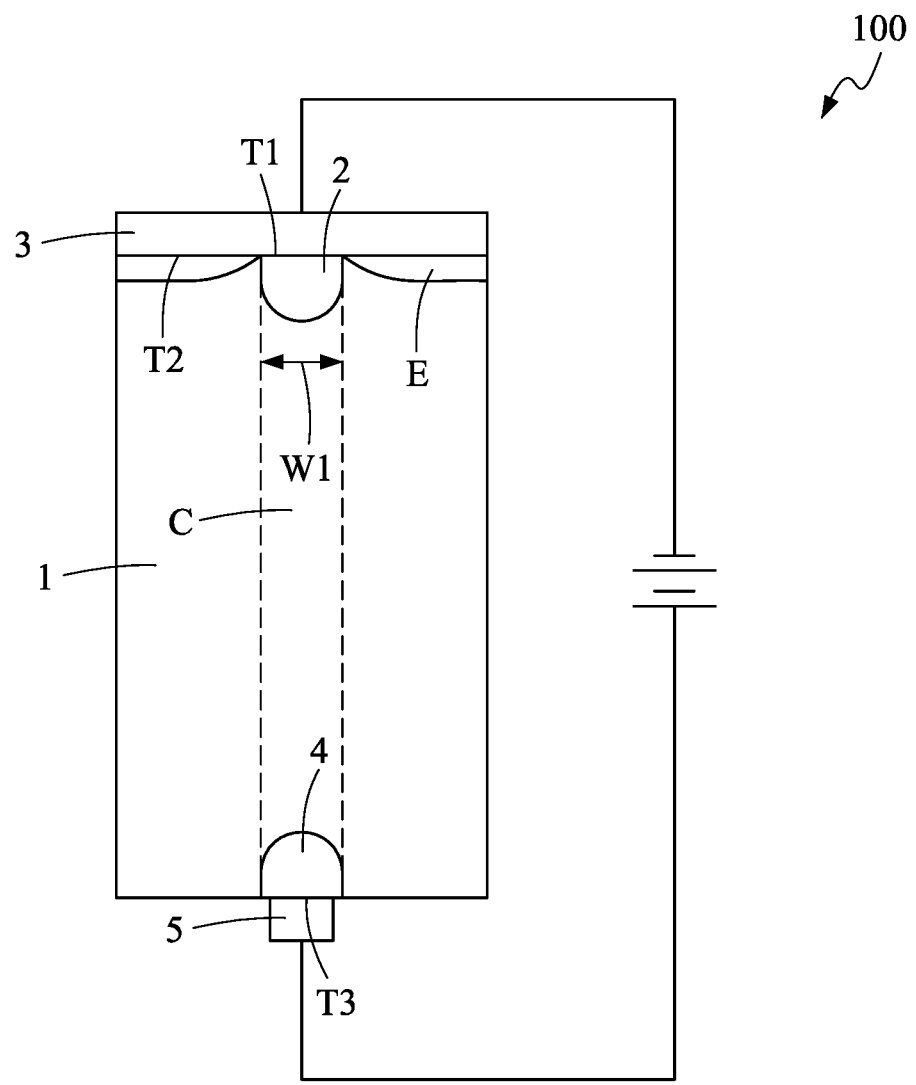
Figure 7:
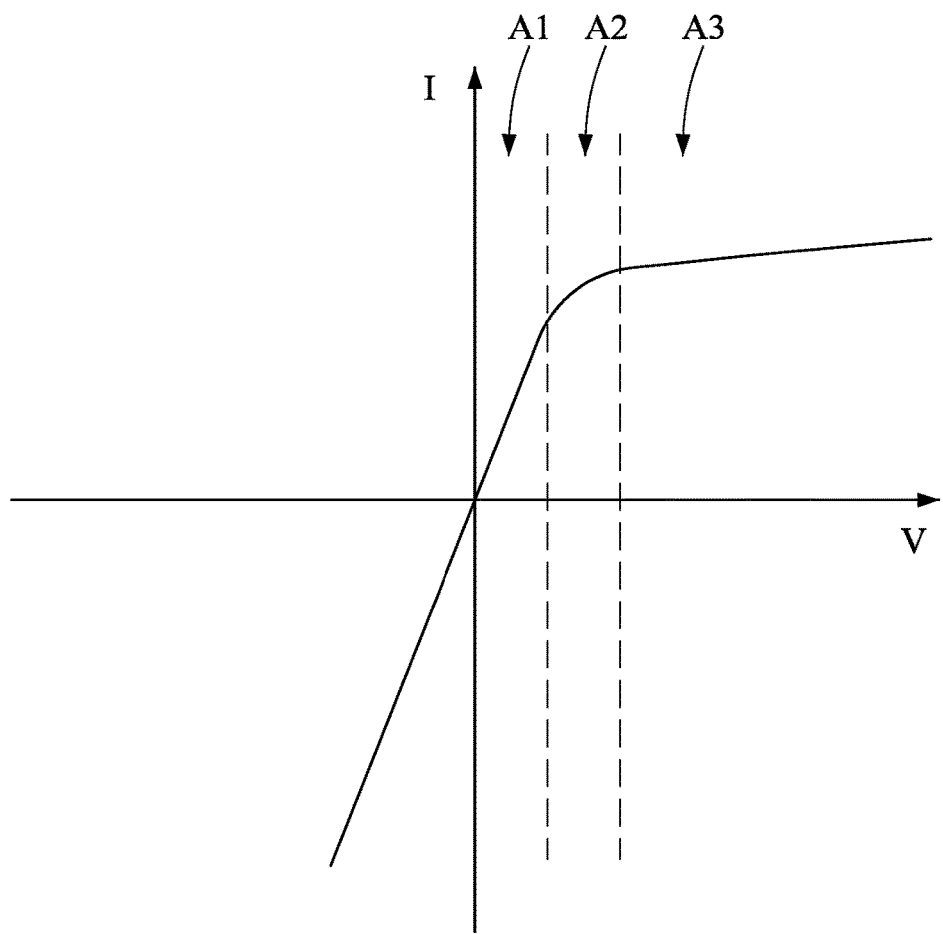
FIG. 7 shows a schematic characteristic curve diagram showing electrical current(s) (I)/voltage(s) (V) relationship of the resistor in accordance with the first preferred embodiment of the present invention.

Furthermore, as shown in FIG. 6B, the resistor 100 is electrically connected to a power source. The lower metal conducting layer 5 is electrically connected to a positive voltage connecting port of the power source, and the upper metal conducting layer 3 is electrically connected to a negative voltage connecting port of the power source. Conduction of electrical currents between the upper and lower ohmic contact interfaces T1, T3 encounters almost no electrical resistance, and therefore is close to direct electrical conduction. As a result, the conductive channel C is rapidly formed from the lower ohmic contact interface T3 to the upper ohmic contact interface T1. It is worth mentioning that the conductive channel C can be formed with the fastest speed in the present invention. The upper reverse-voltage barrier interface T2 is reversely biased, and forms a gradually enlarged depletion region E. At this time, the depletion region E has not yet affected the conductive channel C. Therefore, the resistor 100 has characteristics of an ohmic resistor, and an electrical current-voltage characteristic curve (I-V curve) thereof is distributed as being linear, i.e., as the A1 region as shown in FIG. 7.

Figure 6C:
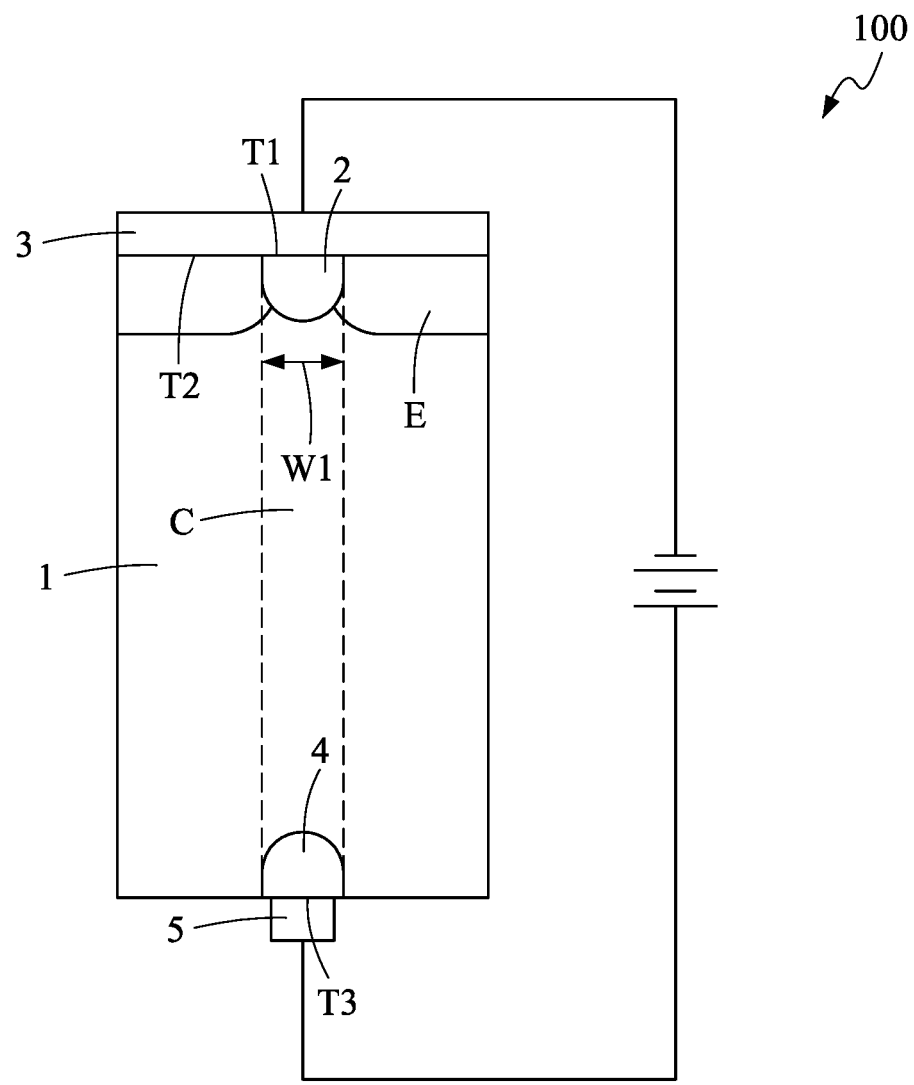

As shown in FIG. 6C, when the depletion region E has been enlarged enough to block the conductive channel C, the conductive channel C is gradually blocked by the growing depletion region E enlarged from the two sides of the upper ohmic region 2 toward the substrate 1. A width W1 of the conductive channel C is gradually reduced inwardly in correspondence to an enlarged extent of the depletion region E. Therefore, a resistance value of the conductive channel C is gradually increased. At this moment, the electrical current-voltage characteristic curve (I-V curve) thereof is distributed as being non-linear, i.e., as the A2 region as shown in FIG. 7. As a result, a resistance value of the resistor 100 is increased when the applied voltage thereon is increased, and a value of electrical currents passing through the resistor 100 gradually tends to vary slowly.

Figure 6D:
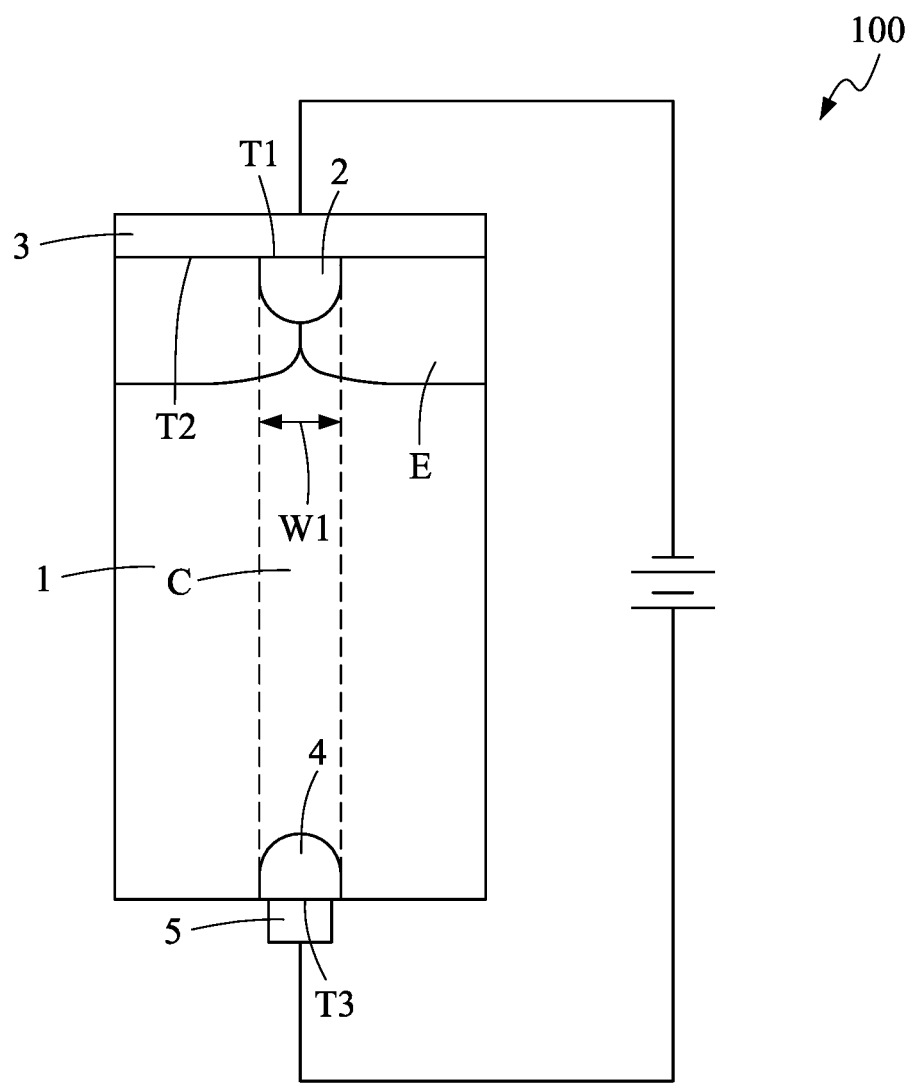

As shown in FIG. 6D, when the depletion region E has been enlarged enough to completely block the conductive channel C, the conductive channel C is pinched to be electrically disconnected. The disconnection situation is called as "pinch-off". In such situation, when carriers departing from the lower ohmic region 4 reaches a point of "pinch-off" via the conductive channel C, the carriers are poured into a space charge region defined around the upper ohmic region 2 and then swept back into the lower ohmic region 4. The resistor 100 then enters a saturation or active mode, and electrical currents passing through the resistor 100 are in a constant electrical current state. At this moment, the electrical current-voltage characteristic curve (I-V curve) is approximately presented as a steady electrical current, i.e., the A3 region in FIG. 7. In other words, the resistance value of the resistor 100 continues to rise when the applied voltage thereon continues to increase, but the value of electrical currents is still constant.

To sum up, when the substrate 1 and the upper metal conducting layer 3 are reversely biased, the resistor 100 in accordance with this first preferred embodiment of the present invention is rapidly conducted via the structure formed between the lower ohmic contact interface T3 and the upper ohmic contact interface T1, and is able to form a structure to pinch to disconnect the conductive channel C via barrier from the depletion region E. As a result, the resistance value of the resistor 100 continues to increase when the applied voltage thereon increases. The value of electrical currents is distributed as being linear when the applied voltage is a low voltage, then becomes distributed as being non-linear when the applied voltage increases, and becomes distributed as a steady electrical current when the applied voltage is a relatively high voltage. The resistor 100 is able to suppress electrical currents generated by high voltages, and is able to avoid burning to be broken due to an excess electrical current load. Hence, a limited range of the applied voltage can be expanded, and an effect of suppressing high electrical currents under a situation of high voltages can be achieved.

Figure 3:
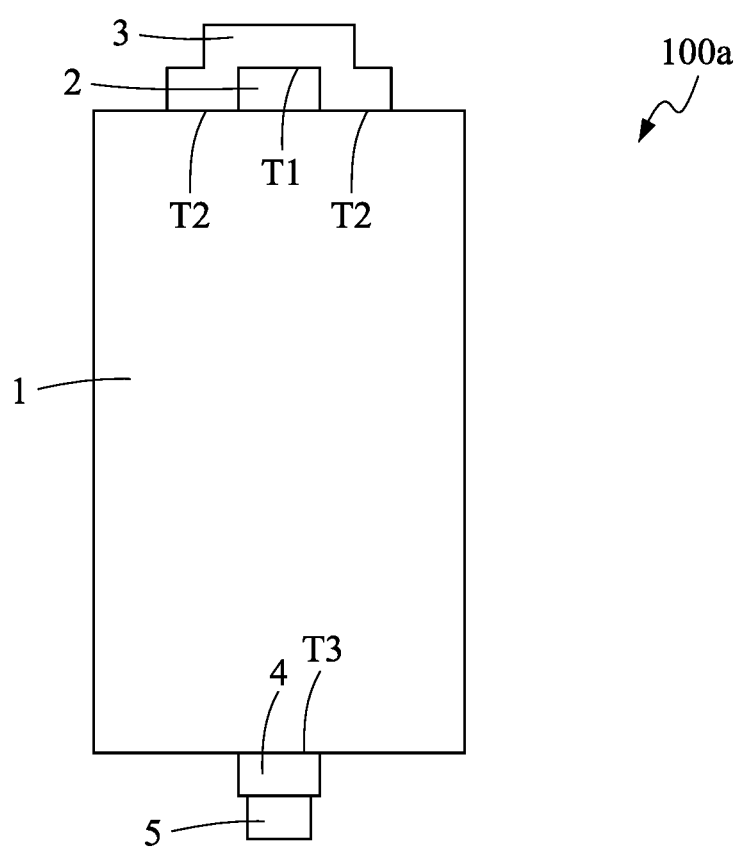
FIG. 3 shows a schematic elevational side view of a resistor in accordance with another second preferred embodiment of the present invention.

As shown in FIG. 3, a resistor 100a in accordance with another second embodiment of the present invention is substantially similar to the first embodiment as described above. This second embodiment is different from the first embodiment in features that the upper ohmic region 2 is formed by protruding upwardly/outwardly from the upper surface of the substrate 1, and the lower ohmic region 4 is formed by protruding downwardly/outwardly from the lower surface of the substrate 1.

Figure 4:
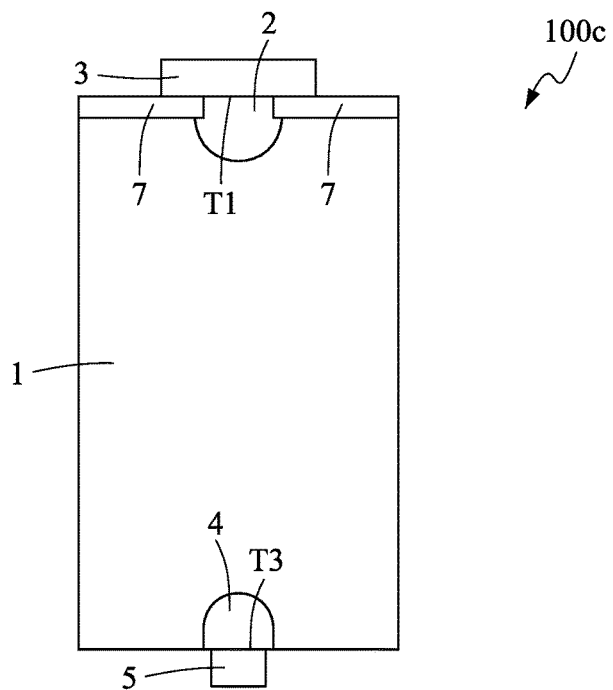
FIG. 4 shows a schematic elevational side view of a resistor in accordance with further another third preferred embodiment of the present invention.

As shown in FIG. 4, a resistor 100c in accordance with further another third embodiment of the present invention is substantially similar to the resistor 100 of the first embodiment as described above. This third embodiment is different from the first embodiment in features that the resistor 100c further comprises an upper insulation layer 7. The upper insulation layer 7 is an oxidized insulation layer. The upper insulation layer 7 is formed at an outer edge of the upper ohmic region 2, and are formed to cover the upper surface of the substrate 1. The upper metal conducting layer 3 covers completely the upper ohmic region 2 and covers the upper insulation layer 7. In this third embodiment, an upper surface of the upper insulation layer 7 and the upper face of the upper ohmic region 2 are disposed to constitute a same surface level. The upper metal conducting layer 3 covers an upper side of the same surface level constituted by the upper ohmic region 2 and the upper insulation layer 7. Of course, the present invention is not limited by the above mentioned third embodiment. The upper face of the upper ohmic region 2 and the upper surface of the substrate 1 can also be disposed to constitute a surface of a same surface level. The upper insulation layer 7 is stacked upwardly on the upper surface of the substrate 1 at the outer edge of the upper ohmic region 2. The upper metal conducting layer 3 are subsequently stacked upwardly above the upper insulation layer 7 and the upper ohmic region 2 in order to cover them.

Figure 5:
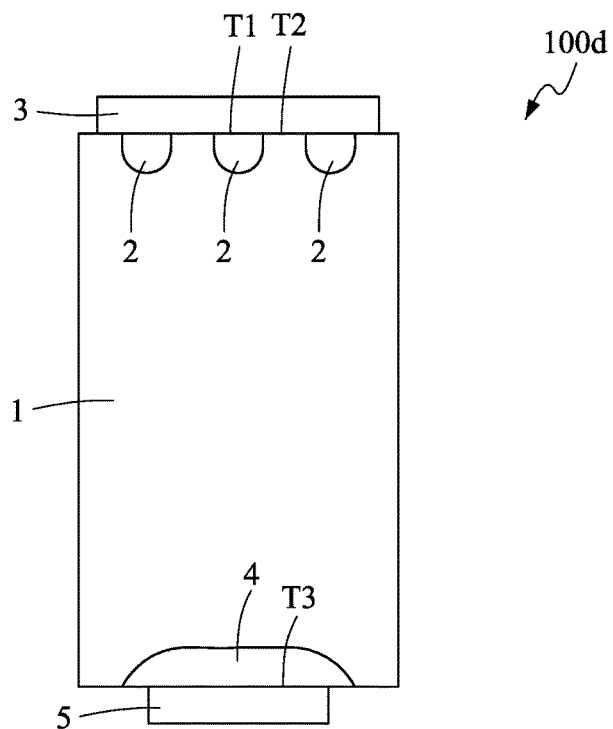
FIG. 5 shows a schematic elevational side view of a resistor in accordance with further another fourth preferred embodiment of the present invention.

As shown in FIG. 5, a resistor 100d in accordance with further another fourth embodiment of the present invention is substantially similar to the resistor 100 of the first embodiment as described above. This fourth embodiment is different from the first embodiment in features that the resistor 100d comprises a plurality of upper ohmic regions 2. The upper metal conducting layer 3 completely covers an upper face of the plurality of upper ohmic regions 2 and covers the upper surface of the substrate 1. A plurality of upper ohmic contact interfaces T1 are respectively formed at contact-interface positions of the upper metal conducting layer 3 with the plurality of upper ohmic regions 2. A plurality of upper reverse-voltage barrier interfaces T2 are respectively formed at contact-interface positions of the upper metal conducting layer 3 with the substrate 1. A plurality of depletion regions E are respectively formed at the plurality of upper reverse-voltage barrier interfaces T2 in order to block the conductive channel C. In this fourth embodiment, the plurality of upper ohmic regions 2 are respectively formed by being embedded downwardly from the upper surface of the substrate 1. Of course, the present invention is not limited by the above mentioned fourth embodiment. The plurality of upper ohmic regions 2 can also be respectively formed by protruding upwardly from the upper surface of the substrate 1.

Figure 8:
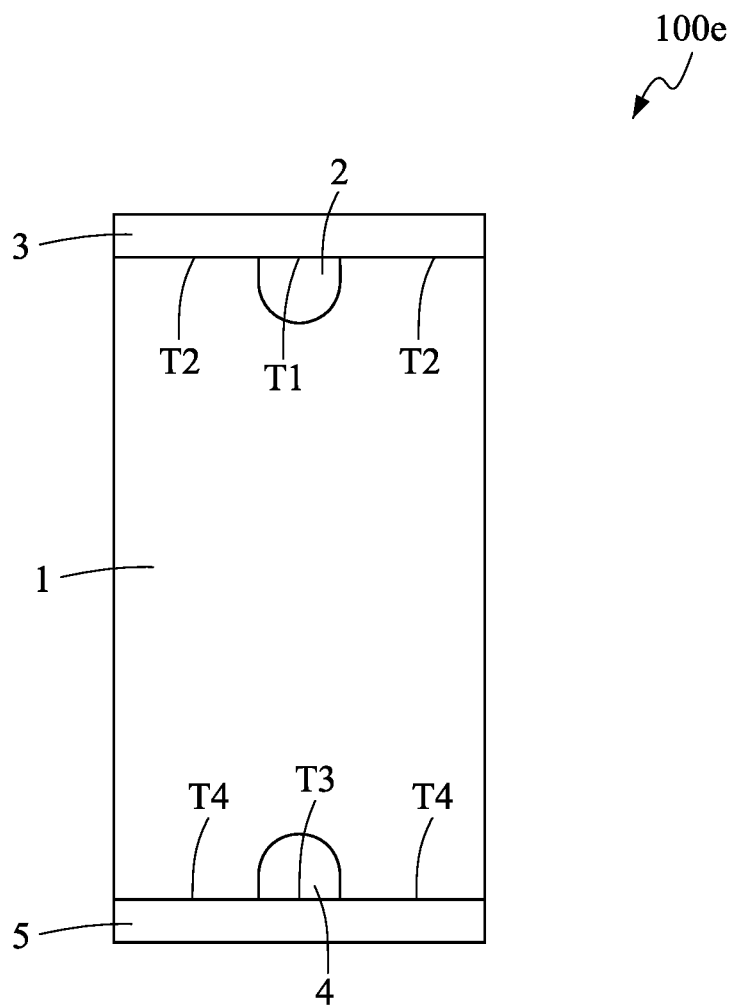
FIG. 8 shows a schematic elevational side view of a resistor in accordance with further another fifth preferred embodiment of the present invention.

As shown in FIG. 8, a resistor 100e in accordance with further another fifth embodiment of the present invention is substantially similar to the resistor 100 of the first embodiment as described above. This fifth embodiment is different from the first embodiment in features that the lower metal conducting layer 5 covers completely the lower face of the lower ohmic region 4, and covers at least two different unconnected parts of the lower surface of the substrate 1. A lower reverse-voltage barrier interface T4 is formed at a contact interface of the lower metal conducting layer 5 with the substrate 1, and a two-way structure symmetrical along an up-down direction is therefore formed. The lower reverse-voltage barrier interface T4 is a Schottky contact interface.

In particular, the resistor 100e is completely same as an upper half of the resistor 100 of the first embodiment as described above. When the lower metal conducting layer 5 is electrically connected to a positive reference voltage, and the upper metal conducting layer 3 is electrically connected to a negative reference voltage, technical solution(s) of the resistor 100e of the currently depicted fifth embodiment in accordance with the present invention is entirely same as the resistor 100 of the first embodiment. Therefore, detailed illustrations for the upper half of the resistor 100e is hereby simplified. When the substrate 1 and the upper metal conducting layer 3 of the resistor 100e are reversely biased, changes of the depletion region E are presented in sequence by drawings starting from FIG. 9A, FIG. 9B (Also referring to the A1 area shown in FIG. 10), FIG. 9C (Also referring to the A2 area shown in FIG. 10) and FIG. 9D (Also referring to the A3 area shown in FIG. 10).

Since the resistor 100e has a two-way structure due to its up-and-down symmetrical design, technical solution(s) of the resistor 100e when the upper metal conducting layer 3 is electrically connected to a positive reference voltage and the lower metal conducting layer 5 is electrically connected to a negative reference voltage is same as technical solution(s) as depicted above when the lower metal conducting layer 5 is electrically connected to a positive reference voltage, and the upper metal conducting layer 3 is electrically connected to a negative reference voltage.

Figure 9A:
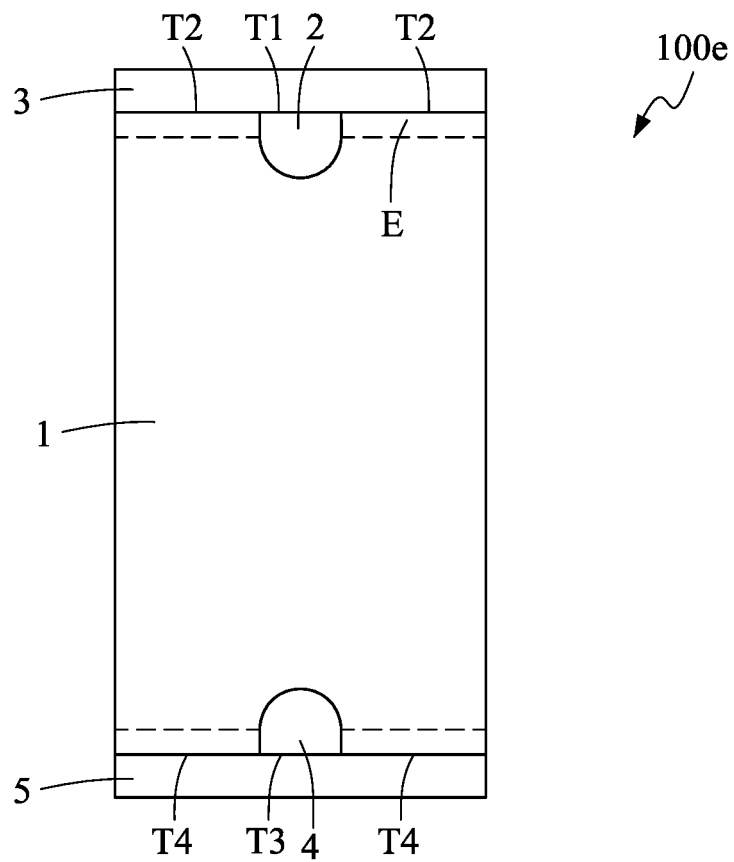
FIGS. 9A to 9G shows schematic elevational side views of the resistor in use in accordance with the fifth preferred embodiment of the present invention.
Figure 9B:
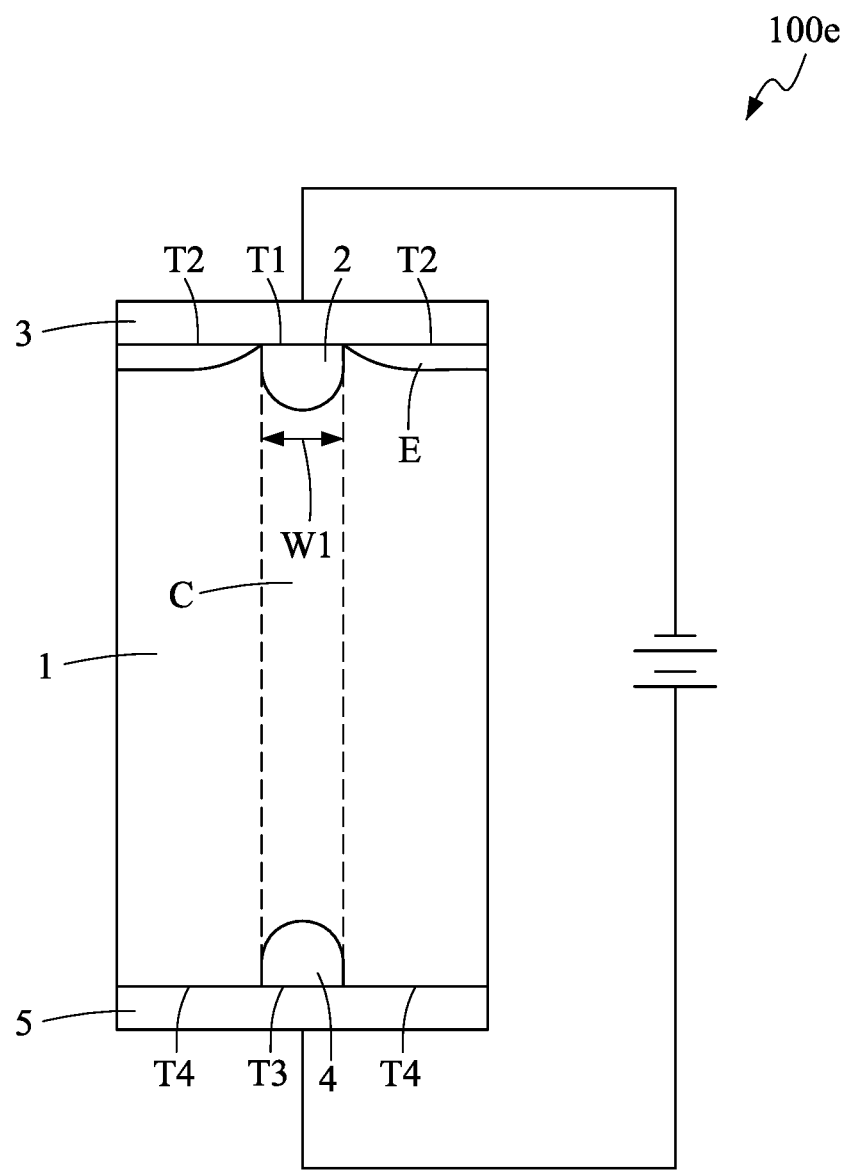
Figure 9C:
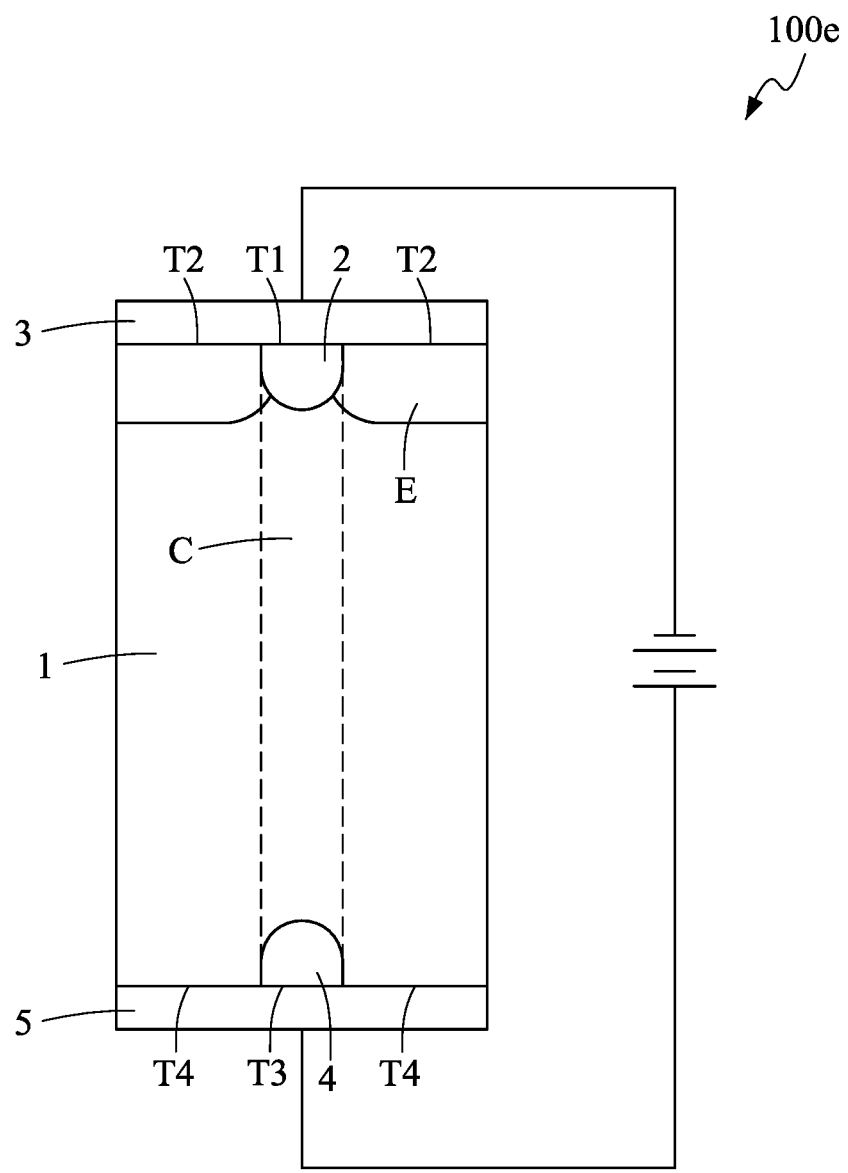
Figure 9D:
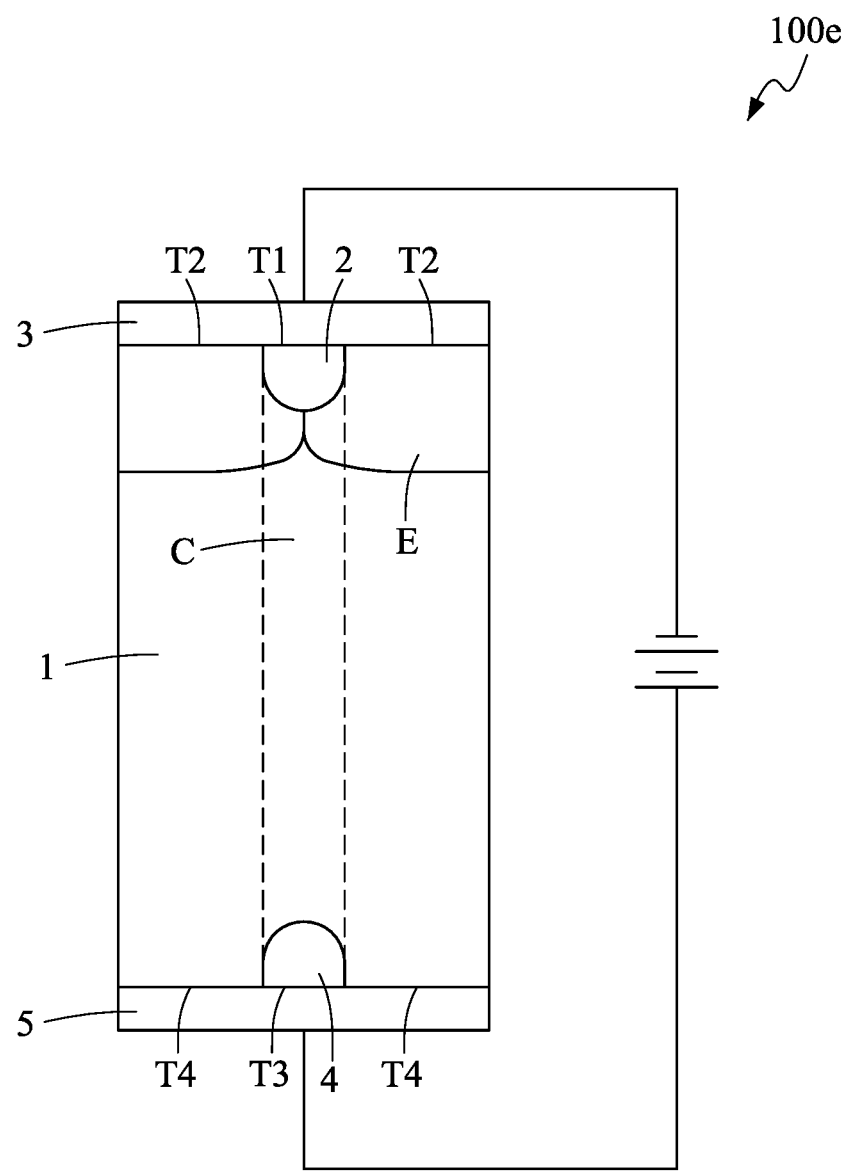
Figure 9E:
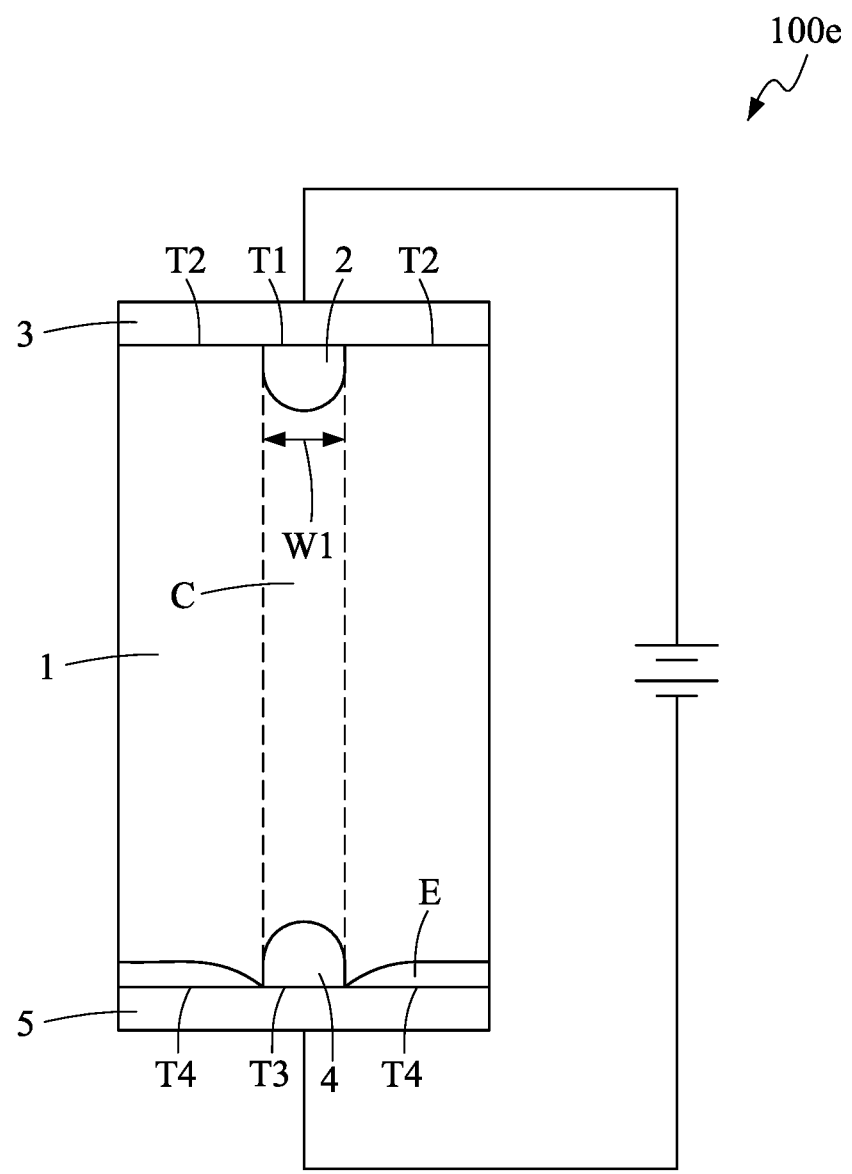
Figure 9F:
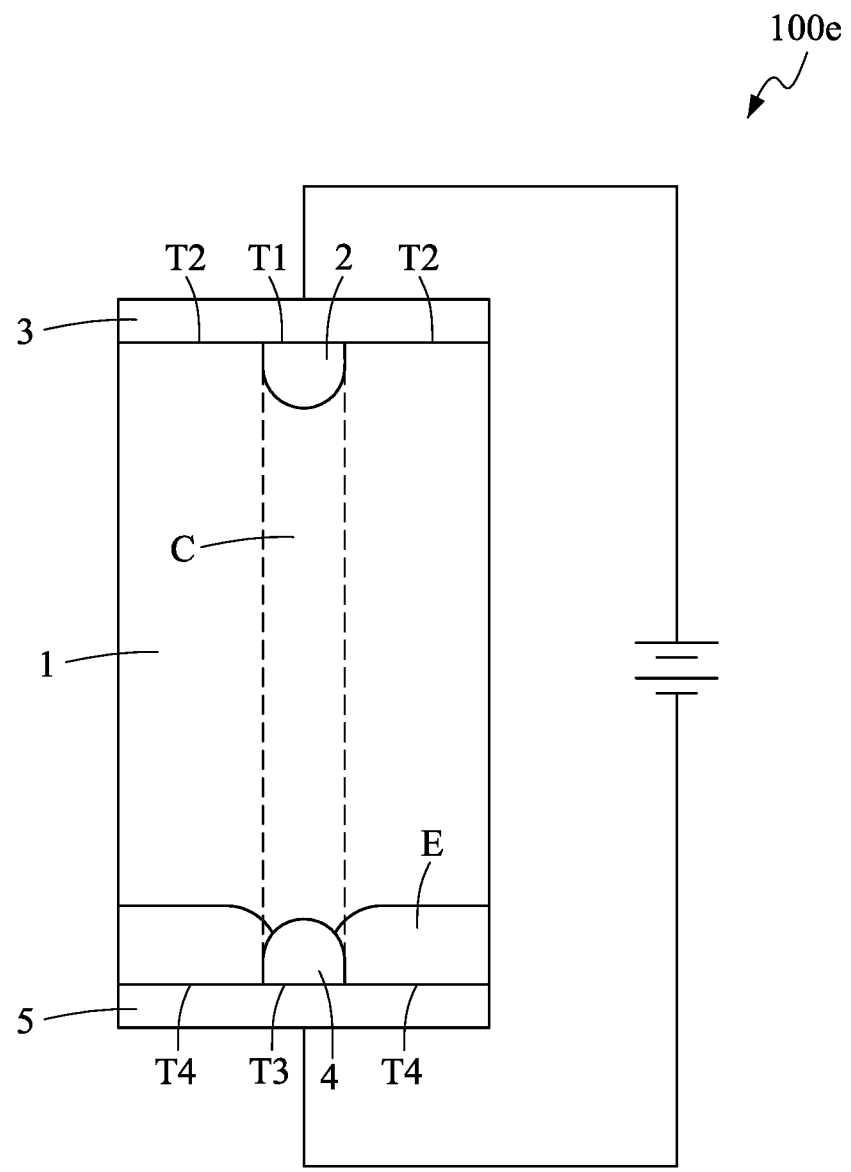
Figure 9G:
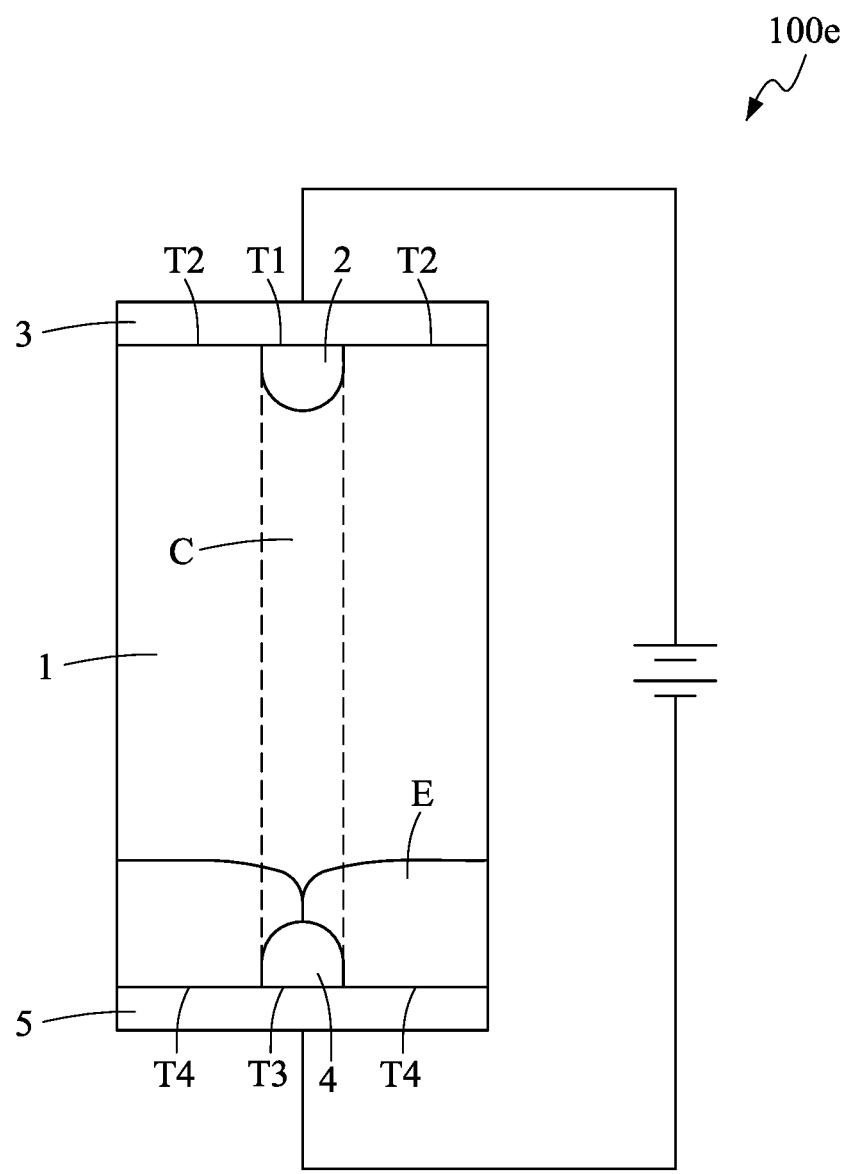
Figure 10:
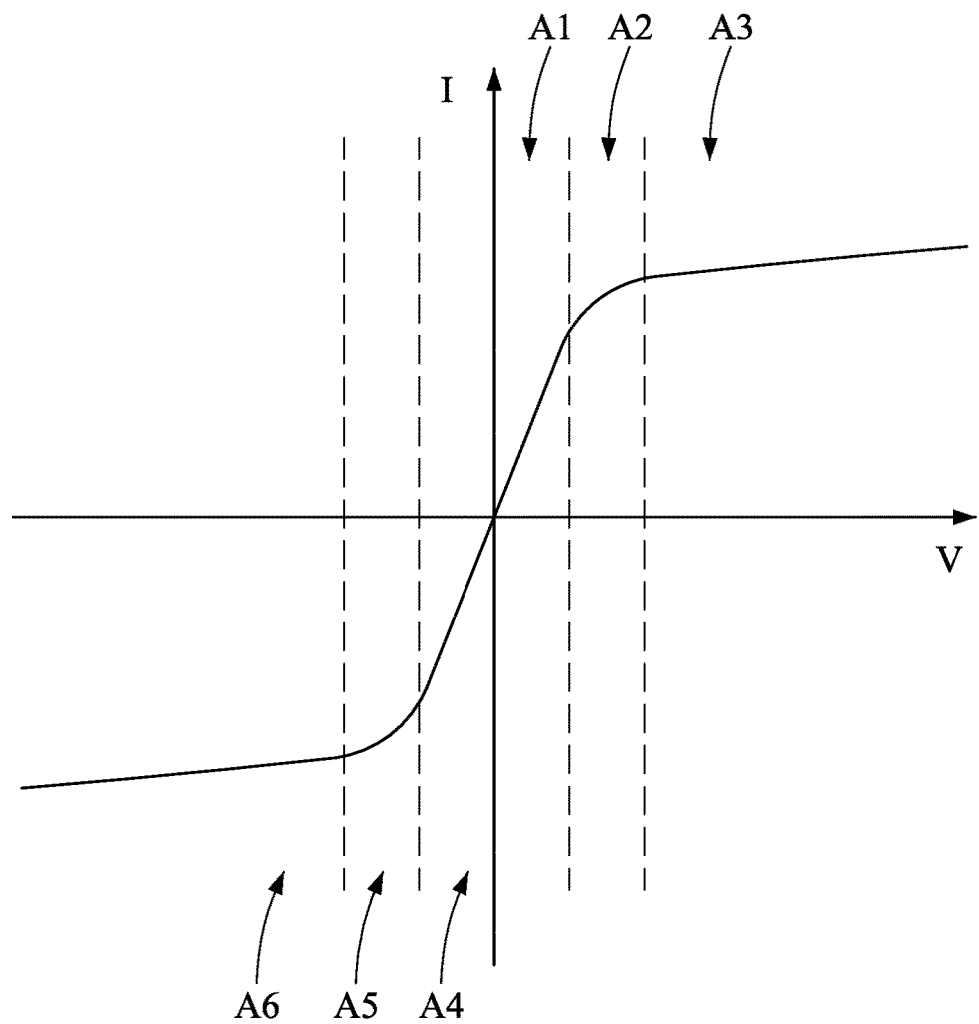
FIG. 10 shows a schematic characteristic curve diagram showing electrical current(s) (I)/voltage(s) (V) relationship of the resistor in accordance with the fifth preferred embodiment of the present invention.

As shown in FIGS. 9E to 9G, when the upper metal conducting layer 3 is electrically connected to a positive reference voltage and the lower metal conducting layer 5 is electrically connected to a negative reference voltage, a conductive channel C for rapid response is formed from the upper ohmic contact interface T1 to the lower ohmic contact interface T3 in the upper metal conducting layer 3 and the substrate 1. The lower reverse-voltage barrier interface T4 forms a depletion region E gradually enlarged (Referring to FIG. 9E and the A4 area in FIG. 10). When the depletion region E has been enlarged enough to block the conductive channel C, a width W1 of the conductive channel C is gradually reduced in correspondence to an enlarged extent of the depletion region E. As a result, a resistive value of the conductive channel C is gradually enlarged (Referring to FIG. 9F and the A5 area in FIG. 10). When the depletion region E has been enlarged enough to completely block the conductive channel C, the conductive channel C is pinched. The resistor 100e then enters a saturation or active mode, and electrical currents passing through the resistor 100e are in a constant electrical current state (Referring to FIG. 9G and the A6 area in FIG. 10).

With the above depicted structure of the above mentioned fifth preferred embodiment, the resistor 100e can become a resistor able to be rapidly electrically conducted along any arbitrary connection direction with other circuits. Its resistive value increases when an applied voltage thereon increases. Besides, the resistor 100e can be protected under high voltages via steady electrical currents.

Of course, the above mentioned preferred embodiments are not described to limit the present invention. Structures of the resistor 100, resistor 100a, resistor 100c, resistor 100d, and resistor 100e can be combined and assembled with each other in order to achieve the same effect by using the same technical solution(s).

Although only the preferred embodiments of the present invention are described as above, the practicing claim scope of the present invention is not limited to the disclosed embodiments. It is understood that any simple equivalent changes, adjustments or modifications to the present invention based on the following claims of the present invention and the content of the above invention description may be still covered within the claimed scope of the following claims of the present invention.

What is claimed is:

1. A resistor having an increasing resistance due to an increasing voltage applied thereon, comprising:
    a substrate, being a first electrically conductive type semiconductor doped with a low concentration;
    an upper ohmic region, being the first electrically conductive type semiconductor doped with a high concentration, and being partially formed at an intermediate position of an upper surface of the substrate;
    an upper metal conducting layer, covering an entire upper face of the upper ohmic region, and covering at least two different unconnected parts of the upper surface of the substrate, an upper ohmic contact interface formed at a contact-interface position of the upper metal conducting layer with the upper ohmic region, and an upper reverse-voltage barrier interface formed at a contact-interface position of the upper metal conducting layer with the substrate;
    a lower ohmic region, being the first electrically conductive type semiconductor doped with a high concentration, the lower ohmic region being disposed opposite to the upper ohmic region and being partially formed at an intermediate position of a lower surface of the substrate; and
    a lower metal conducting layer, covering a lower face of the lower ohmic region, a lower ohmic contact interface formed at a contact-interface position of the lower metal conducting layer with the lower ohmic region;
    wherein when the lower metal conducting layer is electrically connected to a positive reference voltage and the upper metal conducting layer is electrically connected to a negative reference voltage, a conductive channel is formed from the lower ohmic contact interface to the upper ohmic contact interface, the substrate and the upper metal conducting layer are reversely biased, the upper reverse-voltage barrier interface forms a depletion region being enlarged to block the conductive channel when an applied voltage thereon increases, a resistance value of the resistor is increased when the applied voltage is increased.

2. The resistor as claimed in claim 1, wherein the first electrically conductive type semiconductor is an N-type semiconductor.

3. The resistor as claimed in claim 1, wherein the first electrically conductive type semiconductor is a P-type semiconductor.

4. The resistor as claimed in claim 1, wherein the upper ohmic region is embedded inwardly from the upper surface of the substrate.

5. The resistor as claimed in claim 1, wherein the upper ohmic region is formed by protruding outwardly from the upper surface of the substrate.

6. The resistor as claimed in claim 1, wherein a plurality of upper ohmic regions are provided as the upper ohmic region.

7. The resistor as claimed in claim 1, further comprising an upper insulation layer, the upper insulation layer formed at an outer edge of the upper ohmic region and formed to cover the upper surface of the substrate, the upper metal conducting layer covering the whole upper face of the upper ohmic region and covering the upper insulation layer.

8. The resistor as claimed in claim 1, wherein the lower metal conducting layer covers the whole lower face of the lower ohmic region, and covers at least two different unconnected parts of the lower surface of the substrate, a lower reverse-voltage barrier interface is formed at a contact-interface position of the lower metal conducting layer with the substrate, when the upper metal conducting layer is electrically connected to a positive reference voltage and the lower metal conducting layer is electrically connected to a negative reference voltage, a conductive channel is formed from the upper ohmic contact interface to the lower ohmic contact interface, the lower metal conducting layer and the substrate are reversely biased, the lower reverse-voltage barrier interface forms a depletion region being enlarged to block the conductive channel when an applied voltage thereon increases, a resistance value of the resistor is increased when the applied voltage is increased.

* * * * *